(12) United States Patent
Enicks

(10) Patent No.: US 7,550,758 B2
(45) Date of Patent: Jun. 23, 2009

(54) METHOD FOR PROVIDING A NANOSCALE, HIGH ELECTRON MOBILITY TRANSISTOR (HEMT) ON INSULATOR

(75) Inventor: Darwin G. Enicks, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 219 days.

(21) Appl. No.: 11/554,796

(22) Filed: Oct. 31, 2006

(65) Prior Publication Data

US 2008/0099754 A1    May 1, 2008

(51) Int. Cl.
*H01L 29/161* (2006.01)
*H01L 29/165* (2006.01)
*H01L 21/335* (2006.01)
*H01L 21/36* (2006.01)

(52) U.S. Cl. ............... 257/14; 257/618; 257/E33.011; 257/E33.043; 438/479; 438/751

(58) Field of Classification Search ............ 257/14, 257/618, E33.011, E33.043; 438/479, 751
See application file for complete search history.

(56) References Cited

U.S. PATENT DOCUMENTS

| | | | |
|---|---|---|---|
| 5,378,901 A | 1/1995 | Nii | |
| 5,906,708 A | 5/1999 | Robinson et al. | |
| 5,906,951 A * | 5/1999 | Chu et al. | 438/751 |
| 6,064,081 A | 5/2000 | Robinson et al. | |
| 6,323,108 B1 * | 11/2001 | Kub et al. | 438/458 |
| 6,521,041 B2 * | 2/2003 | Wu et al. | 117/94 |
| 6,586,297 B1 | 7/2003 | U'Ren et al. | |
| 6,656,809 B2 | 12/2003 | Greenberg et al. | |
| 6,667,489 B2 | 12/2003 | Suzumura et al. | |
| 6,670,654 B2 | 12/2003 | Lanzerotti et al. | |
| 6,750,484 B2 | 6/2004 | Lippert et al. | |
| 6,781,214 B1 | 8/2004 | U'Ren et al. | |
| 6,858,541 B2 | 2/2005 | Horning | |
| 6,936,910 B2 | 8/2005 | Ellis-Monaghan et al. | |
| 6,995,430 B2 | 2/2006 | Langdo et al. | |
| 7,074,623 B2 | 7/2006 | Lochtefeld et al. | |
| 7,227,176 B2 * | 6/2007 | Wu et al. | 257/18 |
| 2002/0081861 A1 | 6/2002 | Robinson et al. | |
| 2003/0080394 A1 | 5/2003 | Babcock et al. | |
| 2003/0082882 A1 | 5/2003 | Babcock et al. | |
| 2003/0098465 A1 | 5/2003 | Suzumura et al. | |
| 2003/0129802 A1 | 7/2003 | Lanzerotti et al. | |
| 2003/0132453 A1 | 7/2003 | Greenberg et al. | |
| 2003/0146448 A1 | 8/2003 | U'Ren et al. | |

(Continued)

OTHER PUBLICATIONS

International Application No. PCT/US07/80994, Written Opinion mailed May 7, 2008, 6 pgs.

(Continued)

*Primary Examiner*—Evan Pert
(74) *Attorney, Agent, or Firm*—Schwegman, Lundberg & Woessner, P.A.

(57) ABSTRACT

A method and resulting high electron mobility transistor comprised of a substrate and a relaxed silicon-germanium layer formed over the substrate. A dopant layer is formed within the relaxed silicon-germanium layer. The dopant layer contains carbon and/or boron and has a full-width half-maximum (FWHM) thickness value of less than approximately 70 nanometers. A strained silicon layer is formed over the relaxed silicon-germanium layer and is configured to act as quantum well device.

21 Claims, 8 Drawing Sheets

U.S. PATENT DOCUMENTS

| | | |
|---|---|---|
| 2004/0009649 A1 | 1/2004 | Kub et al. |
| 2004/0031979 A1 | 2/2004 | Lochtefeld et al. |
| 2004/0063293 A1 | 4/2004 | Greenberg et al. |
| 2004/0079989 A1 | 4/2004 | Kaneko et al. |
| 2004/0222486 A1 | 11/2004 | Ellis-Monaghan et al. |
| 2004/0251458 A1 | 12/2004 | Mizushima et al. |
| 2005/0051798 A1 | 3/2005 | Lanzerotti et al. |
| 2005/0233534 A1 | 10/2005 | Lanzerotti et al. |
| 2005/0280103 A1 | 12/2005 | Langdo et al. |
| 2006/0011906 A1 | 1/2006 | Bedell et al. |
| 2006/0030093 A1 | 2/2006 | Zhang et al. |
| 2006/0151787 A1 | 7/2006 | Chen et al. |
| 2006/0157733 A1 | 7/2006 | Lucovsky et al. |
| 2006/0292809 A1 | 12/2006 | Enicks et al. |

OTHER PUBLICATIONS

International Application No. PCT/US07/80994, International Search Report mailed May 7, 2008, 2 pgs.

G.S. Kar et al., "Effect of Carbon on Lattice Strain and Hole Mobility in $Si_{1-x}Ge_x$ Alloys", Journal of Materials Science: Materials in Electronics, 13, 2002, pp. 49-55.

D.C. Houghton, "Strain Relaxation Kinetics in $Si_{-x}Ge_x$/Si Heterostructures", J. Appl. Physics, vol. 70, No. 4, Aug. 15, 1991, pp. 2136-2151.

Book: "Properties of Silicon Germanium and SiGe: Carbon", INSPEC, 2000, 14 pages.

Prof. Ulrich Gösele et al., Science and Technology of Semiconductor Wafer Bonding, Duke Univ., Chap. 7, Wafer Bonding Laboratory, Thinning Procedures [online]. Undated [retrieved Aug. 24, 2006]. Retrieved from the Internet: < URL: www.duke.edu/web/wbl/ch7 >.

D. Enicks et al., "Thermal Redistribution of Oxygen and Carbon in Sub-50 NM Strained Layers of Boron Doped SiGeC", ECS Transactions, 3 (7), 2006, pp. 1087-1098.

* cited by examiner

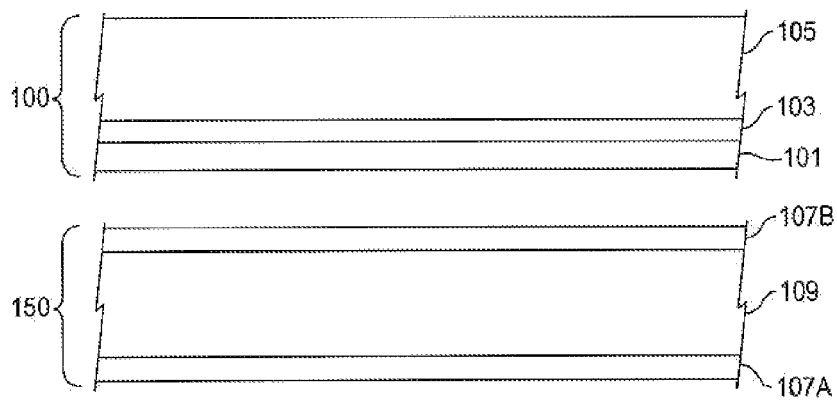
Fig._1A (Prior Art)
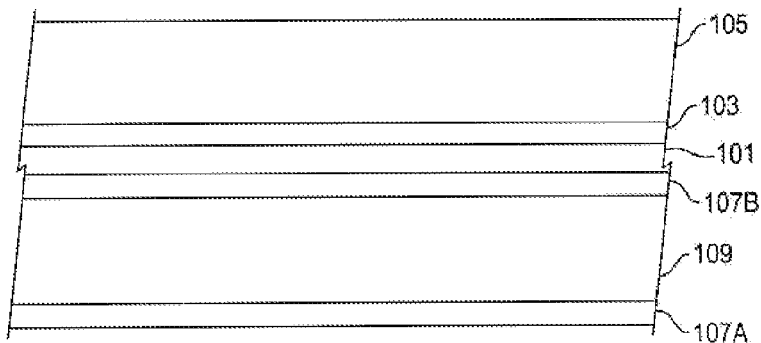
Fig._1B (Prior Art)
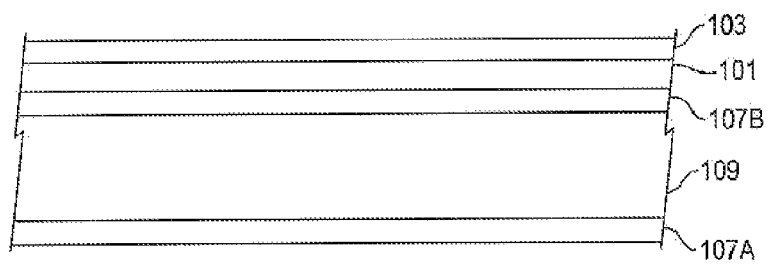
Fig._1C (Prior Art)
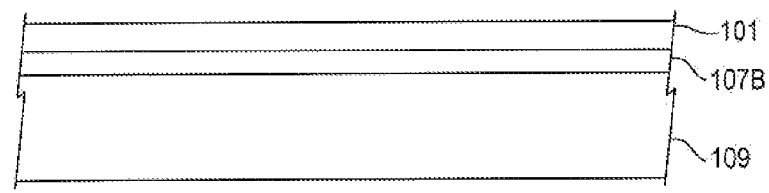
Fig._1D (Prior Art)

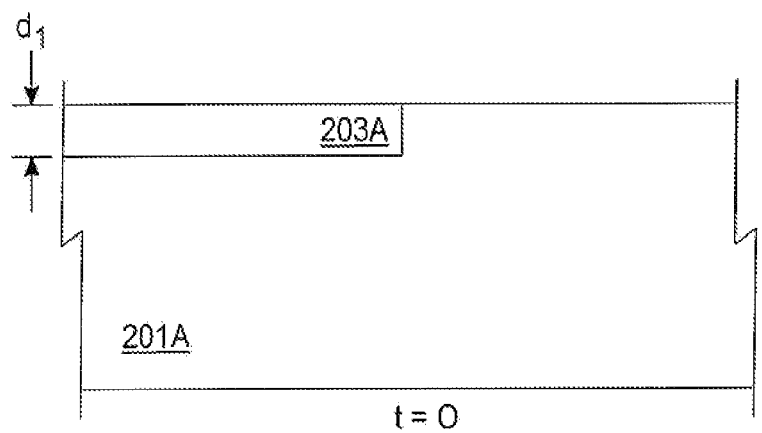
*Fig._ 2A*
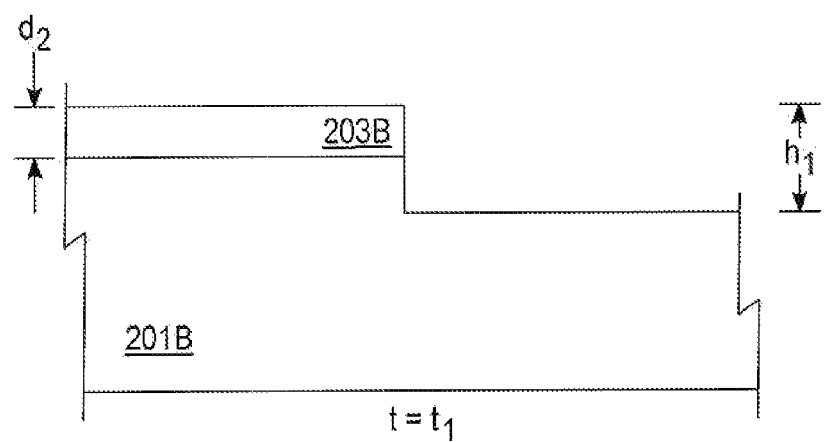
*Fig._ 2B*
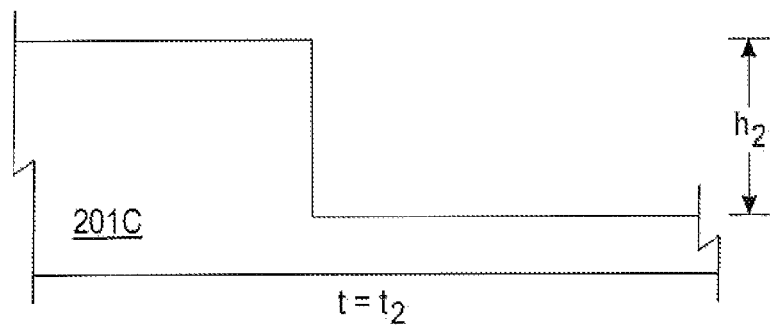
*Fig._ 2C*

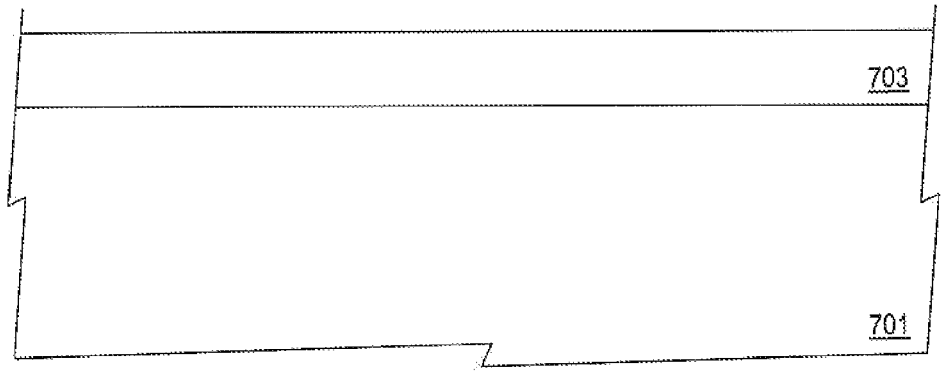
Fig._7A
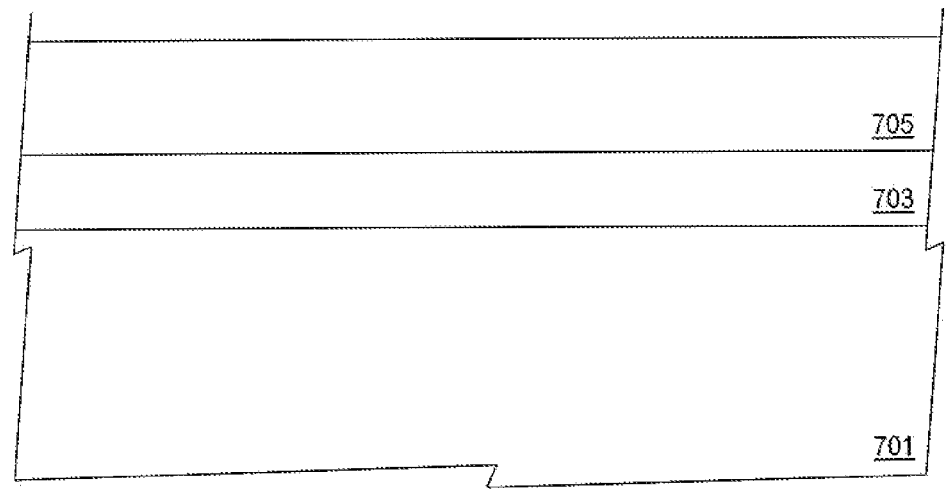
Fig._7B

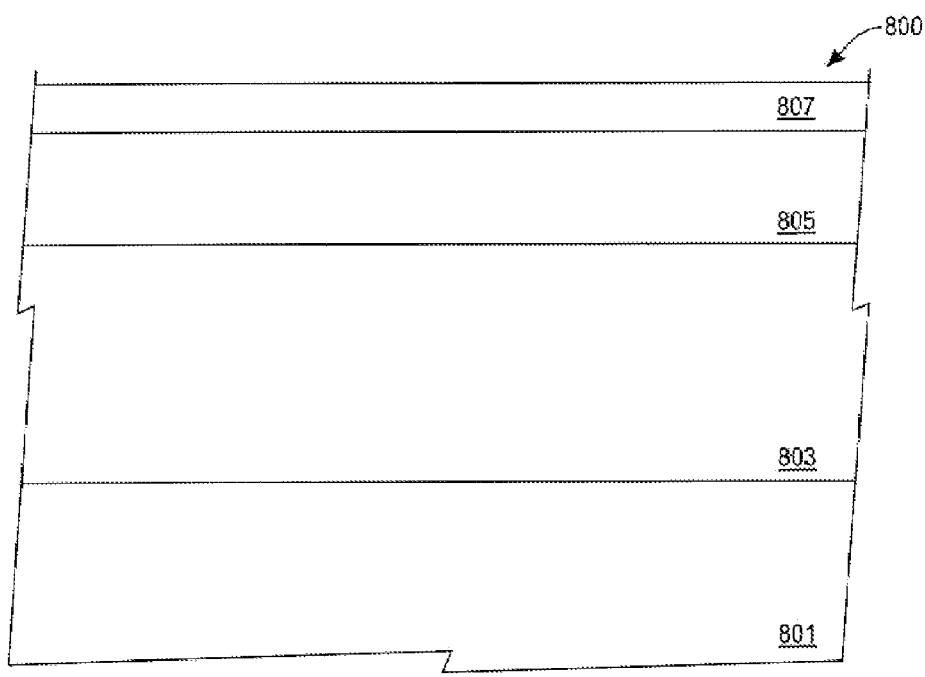
Fig._8
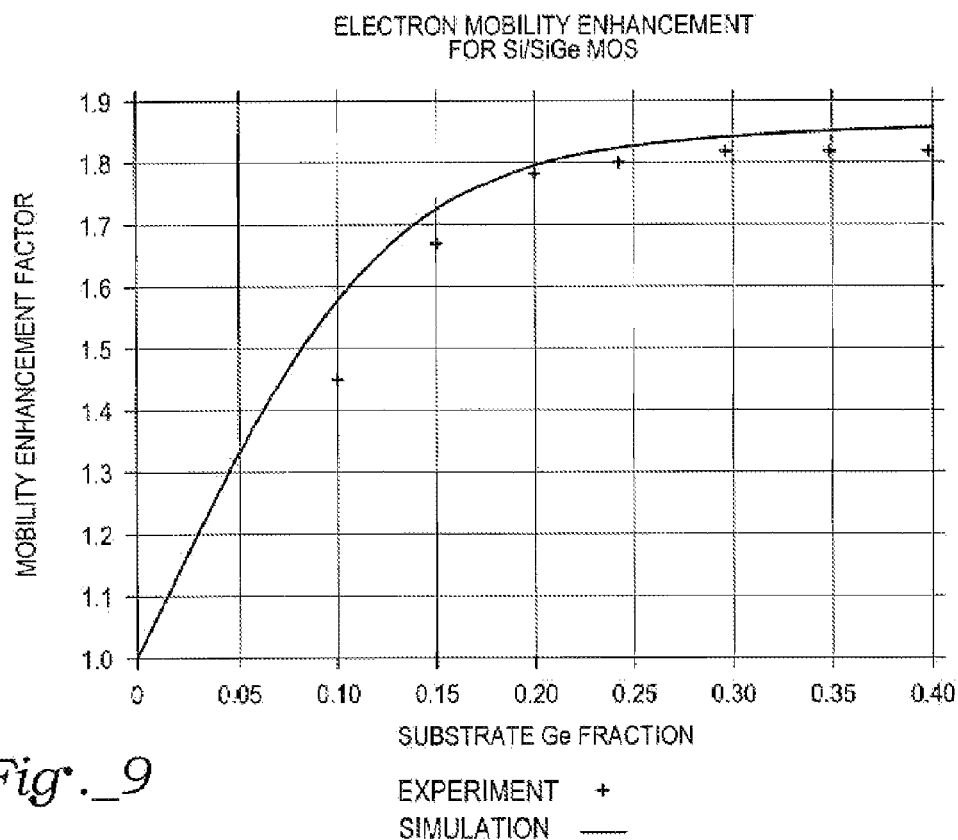
Fig._9

METHOD FOR PROVIDING A NANOSCALE, HIGH ELECTRON MOBILITY TRANSISTOR (HEMT) ON INSULATOR

TECHNICAL FIELD

The invention relates generally to methods of fabrication of integrated circuits (ICs). More particularly, the invention is a method of fabricating high electron mobility transistors on semiconductor-on-insulator substrates.

BACKGROUND ART

Several material systems have emerged as key facilitators to extend Moore's law well into the next decade. These key facilitators include (1) silicon-on-insulator (SOI), (2) silicon-germanium (SiGe), and (3) strained silicon. With reference to SOI and related technologies, there are numerous advantages associated with an insulating substrate. These advantages include reduced parasitic capacitances, improved electrical isolation, and reduced short-channel-effects. Advantages of SOI can be combined with energy bandgap and carrier mobility improvements offered by $Si_{1-x}Ge_x$ and strained silicon devices.

SOI substrates generally include a thin layer of silicon on top of an insulator. Integrated circuit components are formed in and on the thin layer of silicon. The insulator can be comprised of insulators such as silicon dioxide ($SiO_2$), sapphire, or various other insulative materials.

Currently, several techniques are available to fabricate SOI substrates. One technique for fabricating SOI substrates is separation by implantation of oxygen (SIMOX). In a SIMOX process, oxygen is implanted below a surface of a silicon wafer. A subsequent anneal step produces a buried silicon dioxide layer with a silicon overlayer. However, the time required for an implantation in a SIMOX process can be extensive and, consequently, cost prohibitive. Moreover, an SOI substrate formed by SIMOX may be exposed to high surface damage and contamination.

Another technique is bond-and-etch-back SOI (BESOI) where an oxidized wafer is first diffusion-bonded to a non-oxidized water. With reference to FIG. 1A, a silicon device wafer 100 and a silicon handle wafer 150 comprise major components for forming a BESOI wafer. The silicon device wafer 100 includes a first silicon layer 101, which will serve as a device layer, an etch-stop layer 103, and a second silicon layer 105. The etch-stop layer 103 is frequently comprised of carbon. The silicon handle wafer 150 includes a lower silicon dioxide layer 107A, a silicon substrate layer 109, and an upper silicon dioxide layer 107B. The lower 107A and upper 107B silicon dioxide layers are frequently thermally grown oxides formed concurrently.

In FIG. 1B, the silicon device water 100 and the silicon handle water 150 are brought into physical contact and bonded, one to the other. The initial bonding process is followed by a thermal anneal, thus strengthening the bond. The silicon device wafer 100 in the bonded pair is thinned. Initially, most of the second silicon layer 105 is removed by mechanical grinding and polishing until only a few tens of micrometers (i.e. "microns" or µm) remain. A high-selectivity wet or dry chemical etch removes remaining portions of the second silicon layer 105, stopping on the etch-stop layer 103. (Selectivity is discussed in detail, below.) An end-result of the second silicon layer 105 etch process is depicted in FIG. 1C.

During the etching process the silicon handle wafer 150 is protected by a coated mask layer (not shown). In FIG. 1D, the etch-stop layer 103 has been removed using another high-selectivity etchant. As a result of these processes, the first silicon layer 101, serving as a device layer, is transferred to the silicon handle wafer 150. A backside of the silicon substrate layer 109 is ground, polished, and etched to achieve a desired overall thickness.

To ensure BESOI substrates are thin enough for subsequent fabrication steps as well as meeting contemporary demands for ever-decreasing physical size and weight constraints, BESOI requires the presence of the etch-stop layer 103 during the layer transfer process. Currently, two main layer transfer technologies exist: 1) splitting of a hydrogen-implanted layer from a device layer (a hydrogen implantation and separation process), and 2) selective chemical etching. Both technologies have demonstrated they meet requirements of advanced semiconductor processing.

In the hydrogen implantation and separation process, hydrogen ($H_2$) is implanted into silicon having a thermally grown silicon dioxide layer. The implanted $H_2$ produces embrittlement of the silicon substrate underlying the silicon dioxide layer. The $H_2$ implanted wafer may be bonded with a second silicon wafer having a silicon dioxide overlayer. The bonded wafer may be cut across the wafer at a peak location of the hydrogen implant by appropriate annealing.

The BESOI process described is relatively free from ion implant damage inherent in the SIMOX process. However, the BESOI process requires a time consuming sequence of grinding, polishing, and chemical etching.

Contemporary Etch-Stops

As described above, the BESOI process is a manufacturing-oriented technique to build silicon on insulator substrates and is partially dependent upon chemical retching.

Etch-stop performance is described by a mean etch selectivity, S, which defines an etch rate ratio of silicon to the etch-stop layer $$S = \frac{R_{Si}}{R_{es}}$$

where $R_{Si}$ is an etch rate of silicon and $R_{es}$ is an etch rate of the etch-stop. Therefore, a selectivity value where S=1 relates to a case of no etch selectivity.

One method to evaluate etch-stop efficiency is to measure a maximum etch step height across etch-stop and non-etch-stop boundaries. In FIG. 2A, an etch-stop 203A is formed by ion implantation into a portion of a silicon substrate 201A. The etch-stop 203A has a thickness $d_1$ at time t=0 (i.e., prior to application of any etchant). At time t=$t_1$ (FIG. 2B), a partially etched silicon substrate 201B is etched to a depth $h_1$. The etch-stop 203A is now a, partially etched etch-stop 203B. The partially etched etch-stop 203B is etched to a thickness of $d_2$. At time t=$t_2$ (FIG. 2C), the partially etched etch-stop 203B (see FIGS. 2A and 2B) has been completely etched and a fully etched silicon substrate 201C achieves a maximum etch step height of $h_2$. An etch rate of the etch-stop 203A (FIG. 2A) is partially dependent upon both a dopant material implanted as well as an implant profile of the dopant employed. From a practical point of view, the maximum etch step is a critical quantity since it determines an acceptable thickness variation of the device wafer after grinding and polishing prior to etch back, in the BESOI process.

For example, if a maximum etch step is 3 units, the allowable thickness non-uniformity of the device wafer after the usual mechanical thinning procedure should be less than 1.5 units. The mean etch selectivity, S, can be derived from the effective etch-stop layer thickness $d_1$ and the maximum etch step $h_2$ as $$S = \frac{\frac{d_1 + h_2}{t}}{\frac{d_1}{t}}$$

$$\Downarrow$$

$$S = 1 + \frac{h_2}{d_1}$$

where t is the etch time required to reach the maximum etch step height $h_2$. In the prior example, $t_2$ is the etch time required to reach the maximum etch step height $h_2$.

In addition to problems created by reduced selectivity, other problems may arise with using carbon or boron as an etch-stop. A skilled artisan recognizes that carbon diffuses readily in a pure silicon and thus the etch-stop layer readily increases in thickness. Boron also diffuses readily in silicon and grows in thickness after subsequent anneal steps. Carbon and boron etch-stop layers of the prior art are frequently hundreds of nanometers in width (at full-width half-maximum (FWHM)). Therefore, what is needed is an extremely thin and robust etch-stop layer having a high etchant selectivity in comparison with silicon.

SUMMARY

In one embodiment, the present invention is a high electron mobility transistor comprised of a substrate with a relaxed silicon-germanium layer formed over the substrate. The silicon-germanium layer has an etch-stop layer comprised of less than about 70% germanium and contains dopant elements of carbon and/or boron. A strained silicon layer is formed over the relaxed silicon-germanium layer and configured to act as quantum well device.

In another exemplary embodiment, the present invention is a high electron mobility transistor comprised of a substrate and a relaxed silicon-germanium layer formed over the substrate. A dopant layer is formed within the relaxed silicon-germanium layer. The dopant layer contains carbon and/or boron and has a full-width half-maximum (FWHM) thickness value of less than approximately 70 nanometers. A strained silicon layer is formed over the relaxed silicon-germanium layer and is configured to act as quantum well device.

In another exemplary embodiment, the present invention is a method to fabricate a high electron so mobility transistor. The method includes flowing a carrier gas over a substrate in a deposition chamber, flowing a silicon precursor gas over the substrate in the deposition chamber, flowing a germanium precursor gas over the substrate, and forming a relaxed silicon-germanium layer such that the silicon-germanium layer contains less than about 70% germanium. A dopant precursor gas containing carbon and/or boron is flowed over the substrate in the deposition chamber and forms a dopant layer to act as at least a portion of an etch-stop layer. A strained silicon layer is formed over the relaxed silicon-germanium layer to act as quantum well region. The substrate is annealed to a temperature of 900° C. or greater. A thickness of the dopant layer is maintained to less than 70 nanometers when measured as a full-width half-maximum (FWHM) value.

In another exemplary embodiment, the present invention is a high electron mobility transistor comprised of a substrate, a relaxed silicon-germanium layer formed over the substrate, and a boron layer formed within the relaxed silicon-germanium layer. The boron layer has a full-width half-maximum (FWHM) thickness value of less than approximately 70 nanometers. A strained silicon layer is formed over the relaxed silicon-germanium layer and is configured to act as quantum well device.

In another exemplary embodiment, the present invention is a high electron mobility transistor comprised of a substrate, a relaxed silicon-germanium layer formed over the substrate, and a carbon layer formed within the relaxed silicon-germanium layer. The carbon layer has a full-width half-maximum (FWHM) thickness value of less than approximately 70 nanometers. A strained silicon layer is formed over the relaxed silicon-germanium layer and is configured to act as quantum well device.

BRIEF DESCRIPTION OF THE DRAWINGS

FIGS. 1A-1D are cross-sectional views of a prior art bond and etch back silicon on insulator (BESOI) fabrication technique.

FIGS. 2A-2C are cross-sectional views of an etch-stop formed on a silicon substrate, indicating a method to determine etch-stop efficiency.

FIGS. 7A-7B are cross-sectional views of high electron mobility transistor (HEMT) device layers.

FIG. 8 is a cross-sectional view of a quantum well HEMT device.

FIG. 9 is a graph indicating electron mobility enhancement for a Si/SiGe MOS transistor device.

DETAILED DESCRIPTION

Figure 3:
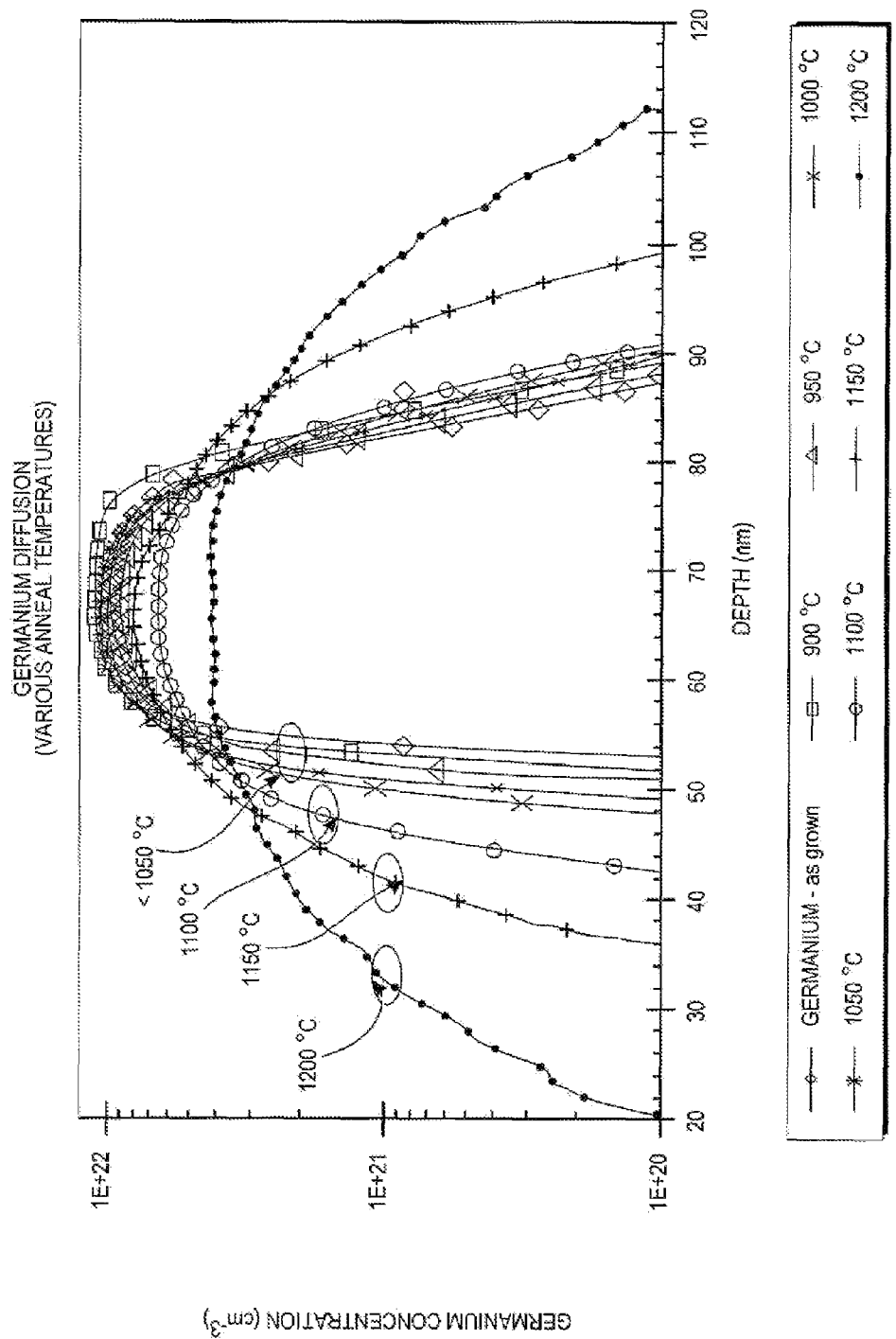
FIG. 3 is a graph indicating germanium diffusion at various anneal temperatures.

Disclosed herein are a fabrication method and a structure resulting therefrom for a high electron mobility transistor (HEMT) formed on, for example silicon-on-insulator (SOI) containing a silicon (Si), germanium (Ge), and/or silicon-germanium (SiGe) nanoscale etch-stop. Various dopant types, such as boron (B), carbon (C), and germanium are considered for fabricating the nanoscale etch-stop. The nanoscale etch-stop described herein has particular applications in BESOI processing. However, the disclosed etch-stop is not limited only to BESOI applications.

Boron-Doped Silicon

Silicon etch rates of all aqueous alkaline etchants are reduced significantly if silicon is doped with boron in concentrations exceeding $2 \times 10^{19}$ cm$^{-3}$. However, widths of boron in ion implanted profiles can be greater than 200 nm to 300 nm depending on chosen quantities of ion implant energy and dosage. Typically, high dosage requirements also lead to a great deal of concentration-dependent outdiffusion. Therefore, the transferred silicon device layer thickness can exhibit a very wide thickness range since the etch process itself will have a wide profile range over which to stop on the boron-doped layer. The wide layer range poses significant process integration problems. By adding carbon and/or germanium, the boron diffusion can be effectively mitigated at temperatures of approximately 1000° C. for 10 seconds or longer.

A device or substrate designer may prefer boron over carbon and/or Ge as a etch-stop depending on device requirements. For example, a design decision may be driven by a preferred majority carrier type and concentration, or a minority carrier type and concentration. One skilled in the art will recognize that adding carbon to a boron-doped layer will diminish carrier mobility. Consequently, more boron is required to compensate for the diminished carrier effect. A skilled artisan will further recognize that the addition of Ge to form a strained lattice in elemental or compound semiconductors enhances in-plane majority carrier hole mobility but diminishes in-plane majority carrier electron mobility. Therefore, if boron is added to a carbon and/or germanium-doped lattice, the fabrication process must be completely characterized. The process will be a function of gas flows, temperatures, and pressures.

Boron may be doped into either a silicon substrate or film, or a compound semiconductor substrate or film. The compound semiconductor film may be chosen from a Group III-V semiconductor compound such as SiGe, GaAs, or InGaAs. Alternatively, a Group II-VI semiconductor compound may be chosen such as ZnSe, CdSe, or CdTe.

Carbon-Doped and/or Germanium Doped Silicon

Traditional germanium implantation and subsequent thermal anneals result in a germanium profile frequently hundreds of nanometers in depth. This profile range is especially true when subsequent anneal temperatures are over 1000° C. An approximation of an "as-implanted" profile width, measured at FWHM, can be determined as $$\text{width} \cong \frac{\text{dose}}{\text{peak concentration}}$$

An $Si_{1-x-y-z}Ge_xC_yB_z$ Etch-Stop

Using a combined SiGe:C:B approach limits both carbon and boron diffusion in silicon when particular combinations of the elements are used. In an exemplary embodiment, composition ranges for the $Si_{1-x-y-z}Ge_xC_yB_z$ layers are:

x (Ge): 0% up to about 70% ($3.5 \times 10^{22}$ cm$^{-3}$)
y (C): 0 cm$^{-3}$ up to about $5 \times 10^{21}$ cm$^{-3}$
Z (B): 0 cm$^{-3}$ up to about $5 \times 10^{21}$ cm$^{-3}$ Secondary-ion mass spectrometry (SIMS) data are displayed, in FIGS. 3-6, for boron, germanium, and carbon diffusion in silicon for various anneal temperatures (or bonding temperatures in the case of BESOI) from 900° C. to 1200° C. for 10 seconds. In particular, FIG. 3 indicates germanium diffusion in silicon at various temperatures. Even at a 1200° C. anneal temperature, a FWHM value of germanium diffusion of approximately 70 nm (i.e., a range of about 30 nm to 100 nm) is achieved. At temperatures of less than 1050° C., a FWHM value of germanium diffusion of less than 40 nm is indicated.

Figure 4:
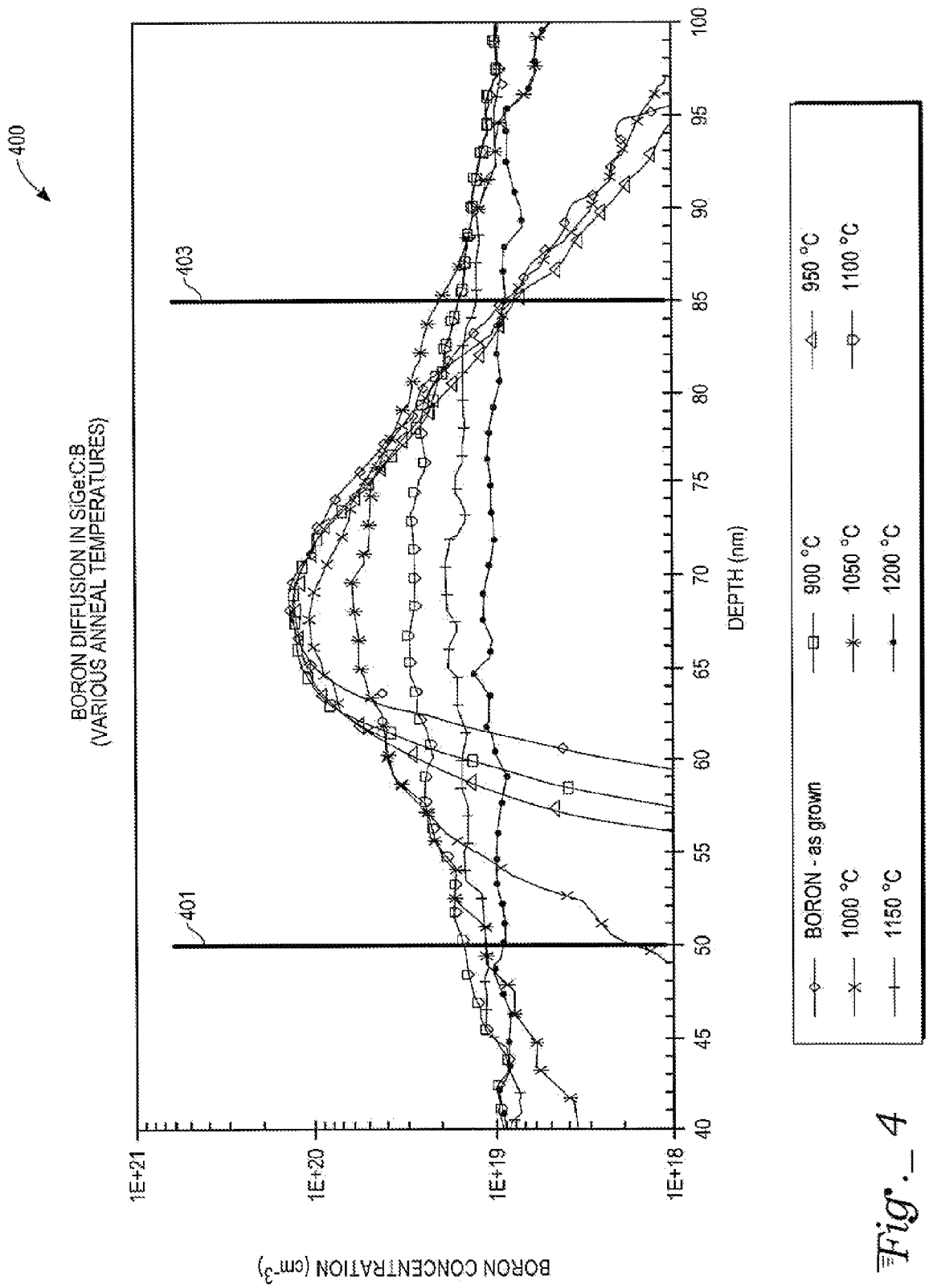
FIG. 4 is a graph indicating a full-width half-maximum (FWHM) depth of a boron profile produced in accordance with the present invention and measured after thermal annealing steps.

With reference to FIG. 4, a SIMS profile graph 400 represents data from a diffusion profile of boron in carbon and Ge-doped silicon (SiGe:C:B). A location of the Ge dopant is illustrated by a lower 401 and an upper 403 vertical line positioned at 50 nm and 85 nm depths, respectively. The boron remains relatively fixed up to temperatures of 1000° C., then diffuses rapidly at higher temperatures (anneal times are 10 seconds at each temperature). However, the presence of both carbon and Ge, as introduced under embodiments of the present invention, reduces boron outdiffusion. Depending on concentrations and temperatures involved, the presence of carbon and Ge reduces overall boron diffusion by a factor of ten or more. In a specific exemplary embodiment, the particular alloy of SiGe:C:B is $Si_{0.975}Ge_{0.02}C_{0.002}B_{0.003}$. Thus, a ratio Of Si to Ge is approximately 50:1 and a ratio of B to C is approximately 1.5:1.

Figure 5:
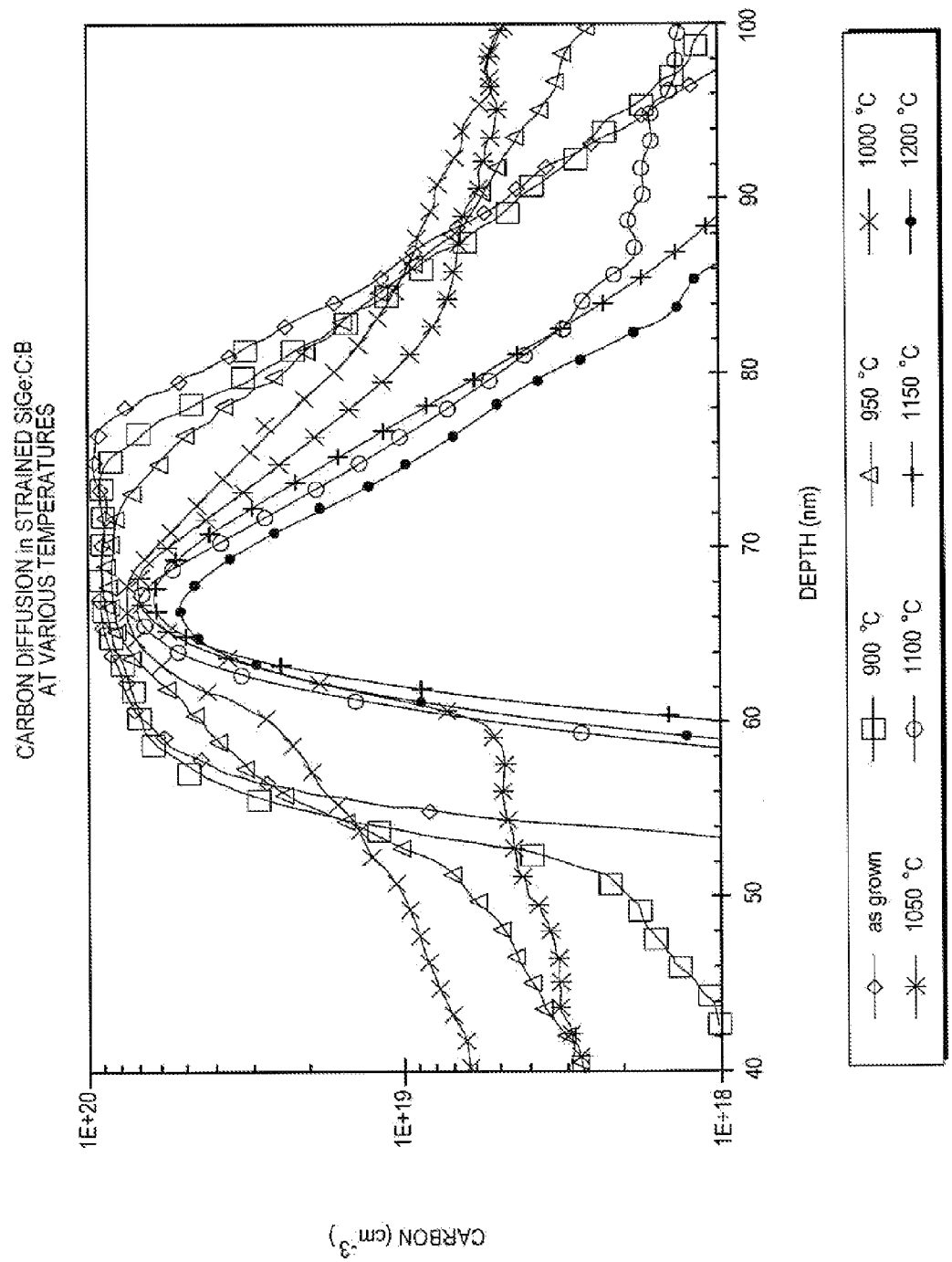
FIG. 5 is a graph indicating carbon diffusion depth in strained SiGe:C:B at various anneal temperatures.

FIG. 5 indicates, in another embodiment, a significantly lower ratio Si to Ge SIMS profile. Carbon diffusion levels in strained SiGe:C:B are indicated as grown and at subsequent anneal temperatures of 900° C. to 1200° C. The data show carbon diffusion primarily from undoped spacer regions (not shown) in which the spacer regions have no B doping. However, a center region of the SIMS profile (i.e., at a depth of roughly 60 nm to 80 nm) indicates that carbon diffusion is significantly mitigated due to the presence of B in the SiGe film. In this exemplary embodiment, the SiGe:C:B film is 79.5% Si, 20% Ge, 0.2% C, and 0.3% boron, prior to thermal anneal ($SiO_{0.795}Ge_{0.2}C_{0.002}B_{0.003}$). Thus a ratio of Si to Ge is approximately 4:1 and a ratio of B to C is approximately 1.5:1.

Figure 6:
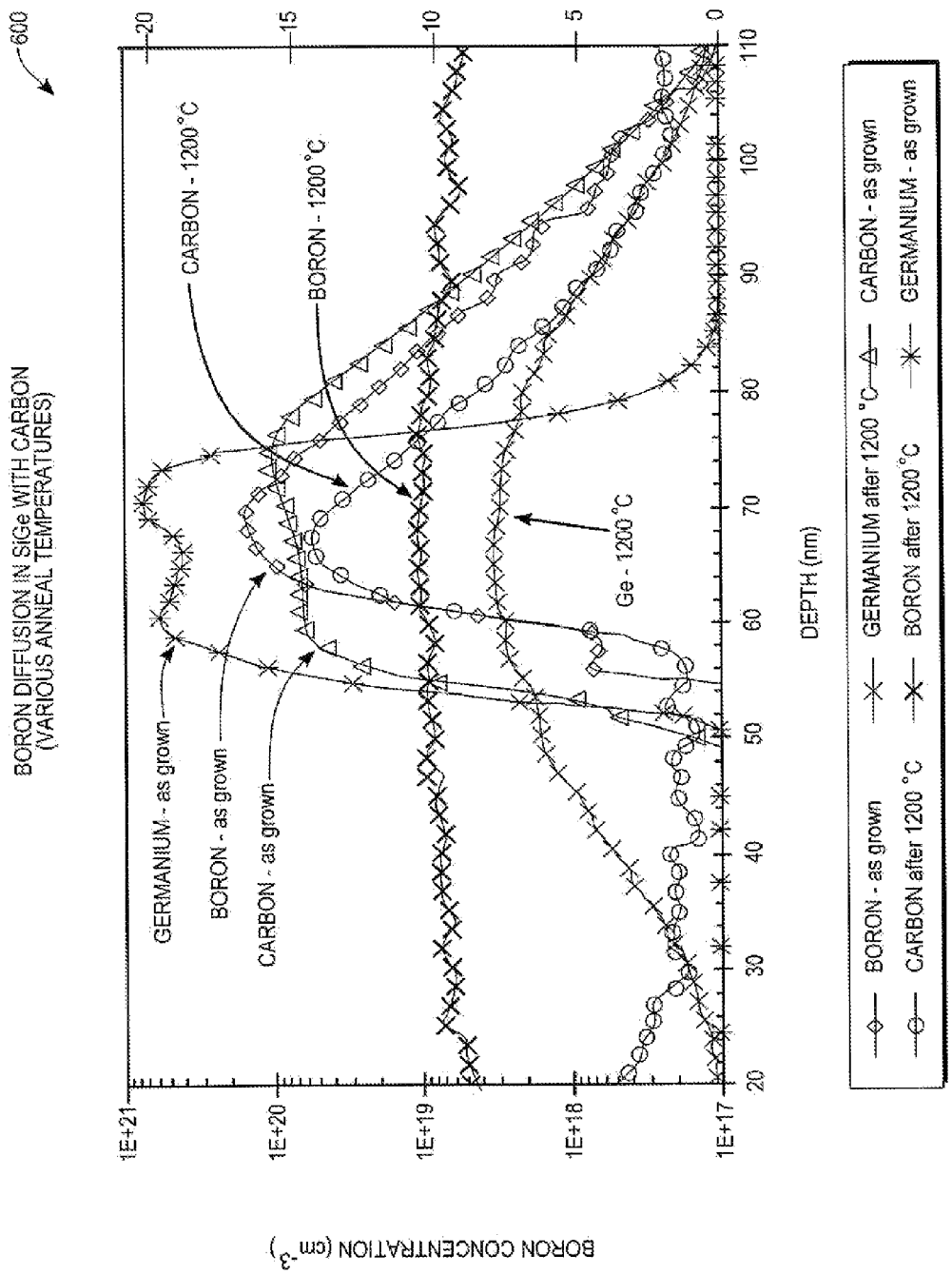
FIG. 6 is a graph indicating boron diffusion depth in SiGe with carbon at various anneal temperatures.

FIG. 6 is a SIMS profile 600 indicating boron diffusion depth in SiGe with carbon at various anneal temperatures. The SiGe film employed in this embodiment is also $Si_{0.795}Ge_{0.2}C_{0.002}B_{0.003}$, similar to the film used in producing the graph of FIG. 5. Note the SIMS profile 600 indicates that, following a 1200° C. anneal for 10 seconds, germanium has diffused from a peak of 20 (i.e., approximately $1.0 \times 10^{22}$ atoms/cm$^3$) to a peak concentration of 7.7% (i.e., approximately $3.85 \times 10^{21}$ atoms/cm$^3$). Boron has diffused from a peak of $1.5 \times 10^{20}$ atoms/cm$^3$ to a peak of $1.0 \times 10^{19}$ atoms/cm$^3$. Additionally, carbon has diffused but the diffusion mechanism involved is due primarily to the SiGe spacers (the outside edges that contained only Ge and C during the initial growth). The carbon peak has diffused from $1.0 \times 10^{20}$ atoms/cm$^3$ down to $7.0 \times 10^{19}$ atoms/cm$^3$ (indicating roughly a 30% peak reduction). The final diffused profile of the carbon is narrower than the as-grown profile. As a result, the final diffused carbon profile, even after a 1200° C. anneal is less than 20 nm wide at FWHM.

Fabrication Process for the Etch-Stop Layer

Overall, process conditions can vary widely depending upon particular devices fabricated, specific equipment types employed, and various combinations of starting materials. However, in a specific exemplary embodiment, the process conditions generally entail the following process conditions, generally at pressures from less than 1 Torr to about 100 Torr and temperatures from 450° C. to 950° C.

| Precursor Gas or Carrier Gas | Flow Rate | Notes |
| --- | --- | --- |
| GeH$_4$ | 0 sccm to 500 sccm | 0 sccm for Si, not Ge |
| SiH$_4$ | 5 sccm to 500 sccm | 0 sccm for Ge, not Si |
| B$_2$H$_6$ | 0 sccm to 500 sccm | 0 sccm = no B in Si or SiGe |
| CH$_3$SiH$_3$ | 0 sccm to 500 sccm | 0 sccm = no C in Si or SiGe |
| He | 0 sccm to 500 sccm | Optional - used for low temperature growth (e.g., <500° C.) |
| H$_2$ | 1 slpm to 50 slpm | |

In addition to germanium tetrahydride (GeH$_4$), another germanium precursor gas may be employed. Additionally, disilane (Si$_2$H$_6$) or another silicon precursor gas may be used in place of silane (SiH$_4$). Disilane deposits silicon at a faster rate and lower temperature than silane.

Additionally, boron trichloride (BCl$_3$) or any other boron precursor gas may be used in place of diborane (B$_2$H$_6$). A carbon precursor gas other than methyl silane (CH$_3$SiH$_3$) may be employed as the carbon precursor. Inert gases such as nitrogen (N$_2$), argon (Ar), helium (He), xenon (Xe), and fluorine (F$_2$) are all suitable carrier gases to substitute for H$_2$ as well.

All gas flow rates may be process, equipment, and/or device dependent. Therefore, gas flow rates outside of the exemplary ranges given may be fully acceptable. Also, a skilled artisan will recognize that the Si$_{1-x-y-z}$Ge$_x$C$_y$B$_z$ layer may be deposited in various profiles as well depending upon electrical characteristics desired.

Amorphization Enhanced Each-Stop

As rioted in FIG. 3, an implanted. Ge profile is more resilient to outdiffusion than a CVD Ge profile. Therefore, additional process steps may be added. For example, following the CVD deposition of a SiGe:C:B nano-scale filmstack, arm amorphization implant may be performed. The implant results in a reduction in film strain along a Si/SiGe heterojunction (contrary to contemporary literature findings). Therefore, by amorphizing the pseudomorphic SiGe:C:B layer the selectivity will be further enhanced. Species which have been found to be acceptable for this step include, among others, boron, germanium, silicon, argon, nitrogen, oxygen (monotonic), carbon, and Group III-V and Group II-VI semiconductors.

Fabrication of an HEMT Device

FIGS. 7A and 7B describe exemplary formation of an HEMT device, which may be transferred as a BESOI device layer. FIG. 7A includes a substrate with device layer 701 and a relaxed semiconductor layer 703 which serves both as an etch-stop layer and also contains the HEMT channel region (not shown). In a specific exemplary embodiment, the substrate with device layer 701 may be comprised of silicon. The relaxed semiconductor layer 703 may be comprised of SisGeC, SiGeB, and/or SiGe:C:B and formed in accordance with methods and elemental ratios described above.

With reference to FIG. 7B, a tensile-strained semiconductor cap layer 705 is formed over the relaxed semiconductor layer 703. In a specific exemplary embodiment, the tensile-strained cap layer is comprised of silicon. Semiconductors in tension have several advantageous properties. For example, placing silicon in tension increases the mobility of electrons moving parallel to a surface of the substrate 701, thus increasing a frequency of operation of the device. Also, a band offset between the relaxed SiGe and the tensile Si confines electrons in the Si layer. Therefore, in an electron channel device (n-channel), the channel can be is removed from the surface or buried.

In an exemplary method of fabrication, the relaxed semiconductor layer 703 is formed by providing a hydrofluoric cleaning of surfaces of the substrate 701, followed by an isopropyl alcohol drying step. The substrate 701 is pre-baked at 950° C. for 60 seconds to remove adsorbed moisture and strip any weak oxides. A seed layer of silicon is grown to a thickness of approximately 300 Å by flowing H$_2$ at 30 slpm and SiH$_4$ at 50 sccm at a temperature of 900° C. The SiH$_4$ flow is maintained at 50 sccm while the temperature is reduced to 600° C. GeH$_4$ is introduced initially at a flow rate of 50 sccm and ramped up to 400 sccm to form a 2500 Å thick SiGe layer. A resultant profile from the flow rate ramping is, for example, trapezoidal in shape from a 5% concentration to a 25% concentration. Thus, a critical thickness is exceeded and the film will relax to its natural lattice dimension. Immediately prior to the final 2500 Å thickness being achieved, the etch-stop layer is produced by introducing either B and/or C via, for example, B$_2$H$_6$ and CH$_3$SiH$_3$. A flow rate of each gas is typically in a range of 200 sccm to 500 sccm. The strained cap layer 705 is then formed by discontinuing the GeH$_4$ flow while maintaining the SiH$_4$ at 50 sccm. An overall thickness of the cap layer 705 is determined by design requirements but will, generally be in a range of 50 Å to 200 Å for contemporary devices. As would be understood by a skilled artisan, all times, temperatures, flow rates, and concentrations are exemplary only and may be varied depending upon exact device and equipment choices.

FIG. 8 is a basic structure of an exemplary quantum well film stack 800. As described with reference to FIG. 7B above, strained Si (e.g., Si in tension) becomes a quantum well region. Hence, a greater propensity exists that electrons will flow in the quantum well region. The exemplary quantum well stack 800 includes a silicon substrate 801, a graded SiGe layer 803, a relaxed SiGe layer 805, and a strained silicon quantum well 807. Additionally, the relaxed SiGe layer 805 contains the etch-stop layer as described above. The nanoscale-level etch-stop layer provides a much tighter film uniformity than is possible with other contemporary SOI fabrication techniques, thus resulting in both reduced ion implant straggle and excessive diffusion of implanted species. Consequently, an electronic device fabricated as described herein has a concomitant increase in performance. For example, an overall effect of electron mobility due to the strained silicon quantum well 807 is quantified in FIG. 9.

FIG. 9 is an electron mobility enhancement graph indicating a mobility enhancement factor as a function of a germanium fraction in the underlying relaxed SiGe layer 805 (FIG. 8). The electron mobility enhancement graph further compares simulated data with experimental results. As the germanium fraction in the substrate (here, the relaxed SiGe layer 805) increases, a resultant larger SiGe lattice parameter occurs. The larger lattice parameter couples into a tensile strain in the silicon quantum well 807. The tensile silicon strain results in a reduction in phonon scattering and also a reduction in effective electron mass further improving device performance. As indicated, a mobility enhancement factor exceeding a factor of 1.8 has been achieved using techniques and methods described herein.

In the foregoing specification, the present invention has been described with reference to specific embodiments thereof. It will, however, be evident to a skilled artisan that various modifications and changes can be made thereto without departing from the broader spirit and scope of the invention on as set forth in the appended claims. For example, although process steps and techniques are shown and described in detail, a skilled artisan will recognize that other techniques and methods may be utilized which are still included within a scope of the appended claims. For example, there are frequently several techniques used for depositing a film layer (e.g., chemical vapor deposition, plasma-enhanced vapor deposition, epitaxy, atomic layer deposition, etc.). Although not all techniques are amenable to all film types described herein, one skilled in the art will recognize that multiple methods for depositing a given layer and/or film type may be used.

Additionally, many industries allied with the semiconductor industry could make use of the HEMT device disclosed herein. For example, a thin-film head (TFH) process in the data storage industry or an active matrix liquid crystal display (AMLCD) in the flat panel display industry could readily make use of the processes and techniques described herein.

The term "semiconductor" should be recognized as including the aforementioned and related industries. The specification and drawings are, accordingly, to be regarded in an illustrative rather than a restrictive sense.

What is claimed is:

1. A high electron mobility transistor comprising:
   a substrate;
   a relaxed silicon-germanium layer formed over the substrate, the silicon-germanium layer comprising an etch-stop layer including less than about 70% germanium and containing one or more dopant elements selected from the group consisting of boron and carbon; and
   a strained silicon layer formed over the relaxed silicon-germanium layer and configured to act as quantum well device.

2. The high electron mobility transistor of claim 1 wherein the dopant layer is less than 70 nanometers measured as a full-width half-maximum (FWHM) thickness value.

3. The high electron mobility transistor of claim 1 wherein the dopant layer is less than 20 nanometers measured as a full-width half-maximum (FWHM) thickness value.

4. The high electron mobility transistor of claim 1 further comprising an amorphization implant, the amorphization implant being selected from the group consisting of boron, germanium, silicon, argon, nitrogen, oxygen, and carbon.

5. The high electron mobility transistor of claim 1 further comprising adding an amorphization implant, the amorphization implant being selected from the group consisting of Group III and Group V semiconductors.

6. The high electron mobility transistor of claim 1 further comprising an amorphization implant, the amorphization implant being selected from the group consisting of Group II and Group VI semiconductors.

7. A high electron mobility transistor comprising:
   a substrate;
   a relaxed silicon-germanium layer formed over the substrate;
   a dopant layer formed within the relaxed silicon-germanium layer, the dopant layer comprising one or more of dopant elements selected from the group consisting of boron and carbon and having a full-width half-maximum (FWHM) thickness value of less than approximately 70 nanometers; and
   a strained silicon layer formed over the relaxed silicon-germanium layer and configured to act as quantum well device.

8. The high electron mobility transistor of claim 7 wherein the dopant layer comprises less than about 70% germanium, the dopant layer further forming an etch-stop layer.

9. The high electron mobility transistor of claim 7 wherein the dopant layer is less than 20 nanometers measured as a full-width half-maximum (FWHM) thickness value.

10. The high electron mobility transistor of claim 7 further comprising an amorphization implant, the amorphization implant being selected from the group consisting of boron, germanium, silicon, argon, nitrogen, oxygen, and carbon.

11. The high electron mobility transistor of claim 7 further comprising adding an amorphization implant, the amorphization implant being selected from the group consisting of Group III and Group V semiconductors.

12. The high electron mobility transistor of claim 7 further comprising an amorphization implant, the amorphization implant being selected from the group consisting of Group II and Group VI semiconductors.

13. A method to fabricate a high electron mobility transistor, the method comprising:
   flowing a carrier gas over a substrate in a deposition chamber;
   flowing a silicon precursor gas over the substrate in the deposition chamber;
   flowing a germanium precursor gas over the substrate;
   forming a relaxed silicon-germanium layer such that the silicon-germanium layer contains less than about 70% germanium;
   flowing a dopant precursor gas over the substrate in the deposition chamber, the dopant precursor gas selected from the group consisting of boron and carbon, the dopant precursor gas forming a dopant layer to act as at least a portion of an etch-stop layer;
   forming a strained silicon layer over the relaxed silicon-germanium layer to act as a quantum well region;
   annealing the substrate to a temperature of 900° C. or greater; and
   maintaining a thickness of the dopant layer to less than 70 nanometers when measured as a full-width half-maximum (FWHM) value.

14. The method of claim 13 wherein the dopant layer is maintained at a thickness of less than about 20 nanometers in thickness when measured as an FWHM value.

15. The method of claim 13 further comprising adding an amorphization implant, the amorphization implant being selected from the group consisting of boron, germanium, silicon, argon, nitrogen, oxygen, and carbon.

16. The method of claim 13 further comprising adding an amorphization implant, the amorphization implant being selected from the group consisting of Group III and Group V semiconductors.

17. The method of claim 13 further comprising adding an amorphization implant, the amorphization implant being selected from the group consisting of Group II and Group VI semiconductors.

18. A high electron mobility transistor comprising:
   a substrate;
   a relaxed silicon-germanium layer formed over the substrate;
   a boron layer formed within the relaxed silicon-germanium layer, the boron layer comprising a full-width half-maximum (FWHM) thickness value of less than approximately 70 nanometers; and
   a strained silicon layer formed over the relaxed silicon-germanium layer and configured to act as quantum well device.

19. The high electron mobility transistor of claim 18 wherein the boron layer comprising less than about 70% germanium, the boron layer further forming an etch-stop layer.

20. A high electron mobility transistor comprising:
   a substrate;
   a relaxed silicon-germanium layer formed over the substrate;
   a carbon layer formed within the relaxed silicon-germanium layer, the carbon layer comprising a full-width half-maximum (FWHM) thickness value of less than approximately 70 nanometers; and
   a strained silicon layer formed over the relaxed silicon-germanium layer and configured to act as quantum well device.

21. The high electron mobility transistor of claim 20 wherein the carbon layer comprises less than about 70% germanium, the carbon layer further forming an etch-stop layer.

* * * * *

UNITED STATES PATENT AND TRADEMARK OFFICE
CERTIFICATE OF CORRECTION

PATENT NO. : 7,550,758 B2
APPLICATION NO. : 11/554,796
DATED : June 23, 2009
INVENTOR(S) : Darwin G. Enicks It is certified that error appears in the above-identified patent and that said Letters Patent is hereby corrected as shown below:

Title page, on page 2, item [56] in column 2, under "Other Publications", line 4, delete "Si-xGex/Si" and insert -- Si1-xGex/Si --, therefor.

In column 1, line 40, after "(BESOI)" insert -- , --.

In column 1, line 42, delete "water." and insert -- wafer. --, therefor.

In column 1, line 53, delete "water" and insert -- wafer --, therefor.

In column 1, line 54, delete "water" and insert -- wafer --, therefor.

In column 1, line 60, delete "(i.e." and insert -- (i.e., --, therefor.

In column 2, line 33, delete "retching." and insert -- etching. --, therefor.

In column 2, line 53, delete "a," and insert -- a --, therefor.

In column 2, line 64, delete "back," and insert -- back --, therefor.

In column 3, line 21, after "in" delete "a".

In column 3, line 51, after "electron" delete "so".

In column 4, line 47, after "example" insert -- , --.

In column 5, line 26, delete "Germanium Doped" and insert -- Germanium-Doped --, therefor.

In column 5, line 47, delete "Z" and insert -- z --, therefor.

In column 6, line 6, delete "Of" and insert -- of --, therefor.

In column 6, line 19, delete "($SiO_{0.795}Ge_{0.2}C_{0.002}B_{0.003}$)" and insert -- ($Si_{0.795}Ge_{0.2}C_{0.002}B_{0.003}$). --, therefor.

In column 6, line 28, delete "20" and insert -- 20% --, therefor.

In column 7, line 16, delete "Amorphization Enhanced Each-Stop" and insert -- Amorphization-Enhanced Etch-Stop --, therefor.

UNITED STATES PATENT AND TRADEMARK OFFICE
CERTIFICATE OF CORRECTION

PATENT NO. : 7,550,758 B2
APPLICATION NO. : 11/554,796
DATED : June 23, 2009
INVENTOR(S) : Darwin G. Enicks It is certified that error appears in the above-identified patent and that said Letters Patent is hereby corrected as shown below:

In column 7, line 17, delete "rioted" and insert -- noted --, therefor.

In column 7, line 17, delete "implanted." and insert -- implanted --, therefor.

In column 7, line 21, delete "arm" and insert -- an --, therefor.

In column 7, lines 39-40, delete "SisGeC" and insert -- SiGeC --, therefor.

In column 7, line 52, after "be" delete "is".

In column 8, line 9, delete "will," and insert -- will --, therefor.

In column 8, line 50, before "as" delete "on".

Signed and Sealed this

Twenty-fifth Day of August, 2009

David J. Kappos
*Director of the United States Patent and Trademark Office*